(12) United States Patent
Asano (10) Patent No.: US 6,665,324 B1
(45) Date of Patent: Dec. 16, 2003

(54) SEMICONDUCTOR LASER UNIT HAVING OPTICAL GUIDE LAYERS WITH INCREASED TOTAL THICKNESS AND EMPLOYING JUNCTION-UP CONFIGURATION

(75) Inventor: Hideki Asano, Kaisei-machi (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 0 days.

(21) Appl. No.: 09/514,327

(22) Filed: Feb. 28, 2000

(30) Foreign Application Priority Data

Feb. 26, 1999 (JP) .............................. 11-050356

(51) Int. Cl.[7] ................................................ H01S 5/00
(52) U.S. Cl. .............................. 372/43; 372/36; 372/46
(58) Field of Search ............................... 372/43, 36, 46

(56) References Cited

U.S. PATENT DOCUMENTS

| | | | | |
|---|---|---|---|---|
| 5,559,819 A | * | 9/1996 | Abe et al. ..................... | 372/46 |
| 5,586,136 A | * | 12/1996 | Honda et al. .................. | 372/43 |
| 5,625,634 A | * | 4/1997 | Ukita et al. ................... | 372/43 |
| 5,642,371 A | * | 6/1997 | Tohyama et al. .............. | 372/20 |
| 6,075,799 A | * | 6/2000 | Uchida et al. ................. | 372/27 |
| RE37,177 E | * | 5/2001 | Ukita et al. ................... | 372/43 |
| 6,303,405 B1 | * | 10/2001 | Yoshida et al. ............... | 438/46 |
| 6,387,721 B1 | * | 5/2002 | Hashimoto et al. ........... | 438/46 |

* cited by examiner

Primary Examiner—Quyen Leung
Assistant Examiner—Delma R. Flores-Ruiz
(74) Attorney, Agent, or Firm—Sughrue Mion, PLLC (57) ABSTRACT

A semiconductor laser device is bonded to a heat sink. The semiconductor laser device contains a stripe structure having a width equal to or greater than 10 micrometers, and including a first optical guide layer of a first conductivity type, an active layer, and a second optical guide layer of a second conductivity type. A total thickness of the first and second optical guide layers is equal to or more than 0.5 micrometers. The semiconductor laser device is soldered onto the heat sink at a surface of the semiconductor laser device where the surface located is farther from the active layer than other surfaces of the semiconductor laser device.

7 Claims, 7 Drawing Sheets

SEMICONDUCTOR LASER UNIT HAVING OPTICAL GUIDE LAYERS WITH INCREASED TOTAL THICKNESS AND EMPLOYING JUNCTION-UP CONFIGURATION

BACKGROUND OF THE INVENTION

1. Field of the Invention

The present invention relates to a semiconductor laser unit having a stripe structure.

2. Description of the Related Art

Conventionally, a wide-stripe structure is employed for realizing a high-power semiconductor laser device. In the wide-stripe structure, the active layer is formed to have a width of more than 10 micrometers to increase the output power, while the width of the active layer in a usual single-mode laser device is about 3 micrometers. Therefore, a number of high-order transverse modes are mixed in oscillated light, and when the oscillation power is increased, the mode of oscillated light is liable to change to a different mode due to spatial hole burning of carriers, which is caused by high density distribution of photons in the resonant cavity. At the same time, near-field pattern, far-field pattern, and oscillation spectrum vary. In addition, the optical output power also varies due to the difference in efficiency of current-to-light conversion. This phenomenon is called a kink in the current/optical output power characteristic of a semiconductor laser device.

Therefore, when the above high-power semiconductor laser device is used as an excitation light source in a solid-state light emitting apparatus, a laser-diode-excited SHG solid-state laser, or a light emitting apparatus to which an optical fiber is connected, the following problems arise.

When the above high-power semiconductor laser device is used as an excitation light source in a solid-state laser apparatus, only a component coupled with an oscillation mode of the solid-state laser resonator is utilized as an excitation light from among oscillated light generated by the semiconductor laser device and condensed by a lens system. Therefore, the output intensity greatly varies with change of the transverse mode. In addition, since the absorption spectrum of the solid-state laser has a fine absorption spectrum structure in a narrow wavelength band, an amount of absorbed light varies in response to the variation of an oscillation spectrum. Thus, the output intensity of the solid-state laser apparatus is further affected by the variation of the oscillation spectrum, in addition to the change of the transverse mode. Further, use of a spatial or spectral portion of the light generated by the solid-state laser device increases high-frequency noise accompanied by switching between transverse modes.

The laser-diode-excited SHG solid-state laser is a visible-range light emitting apparatus in which a wavelength of a fundamental wave generated by a solid-state laser apparatus is converted to a half of the wavelength by using a nonlinear crystal to generate a second harmonic wave. When the high-power semiconductor laser device is coupled to a solid-state laser crystal or a nonlinear crystal for generating a second harmonic wave, the above noise is further increased due to the nonlinear effect.

When the high-power semiconductor laser device is coupled to an optical fiber, the optical fiber is used as an output end. Therefore, it is possible to separate the semiconductor laser device which needs heat dissipation, and miniaturize the light source portion. In addition, since an optical fiber cuts off components of light other than a component in the propagation mode, the optical fiber functions as a mode filter to improve optical quality.

Nevertheless, when the semiconductor laser device and the optical fiber are coupled, the above-mentioned problems of the variation of the output intensity due to the change of the transverse mode in the semiconductor laser device and the noise due to the switching between transverse modes also arise. In particular, in applications for generating high-quality images, the image generating operation is impeded by noise even when the noise is at a level of about 1 percent. However, conventional high-power semiconductor laser devices cannot achieve such a severe noise requirement.

In the high-power semiconductor laser devices, the above variation of the output intensity and noise caused by the transverse-mode oscillation can be reduced by disposing materials having refractive indexes different from that of an active layer on both sides of the active layer in the direction of the width of the active layer, i.e., in the lateral (transverse) direction, and arranging an index-guided waveguide structure for achieving confinement of optical waves in the transverse modes. However, if the effect of the confinement is too great, the increase in the photon density in the active layer causes catastrophic optical damage (COD) to decrease the output intensity. Otherwise, if the effect of the confinement is too small, the efficiency of the current-to-light conversion decreases, and therefore the output intensity decreases.

In addition, conventionally, it is difficult to suppress the noise to several percent even when the above index-guided waveguide structure is used.

SUMMARY OF THE INVENTION

The object of the present invention is to provide a short-wavelength semiconductor laser unit having a stripe structure, achieving low-noise oscillation and providing a stable optical output.

The object of the present invention is accomplished by the present invention, which provides a semiconductor laser unit containing a semiconductor laser device and a heat sink to which the semiconductor laser device is bonded. The semiconductor laser device contains a stripe structure having a width equal to or greater than 10 micrometers, and including a first optical guide layer of a first conductivity type, an active layer, and a second optical guide layer of a second conductivity type. A total thickness of the first and second optical guide layers is equal to or more than 0.5 micrometers. The semiconductor laser device is soldered onto the heat sink at a surface of the semiconductor laser device, where the surface is located farther from the active layer than other surfaces of the semiconductor laser device. That is, the semiconductor laser device is bonded to the heat sink so as to form a so-called junction-up configuration.

Since, according to the present invention, the optical guide layers, which guide light waves, are formed to have a total thickness not less than 0.5 micrometers in the stripe structure having a thickness not less than 10 micrometers, and photon density in the light-emitting area is made small, it is possible to prevent spatial hole burning of carriers due to the high photon density distribution, and reduce the variation of the optical output due to the change of the transverse mode. Thus, a stable optical output can be obtained.

In addition, since the photon density is made small, it is also possible to prevent the occurrence of catastrophic optical damage (COD). This also makes the optical output stable.

Further, conventionally, a semiconductor laser device or the like is soldered onto a heat sink to form the so-called junction-down configuration. That is, conventionally, the semiconductor laser device is bonded to the heat sink at a surface, which is located near the active layer, of the semiconductor laser device. On the other hand, according to the present invention, the semiconductor laser device is soldered onto the heat sink to realize the so-called junction-up configuration. That is, the semiconductor laser device is bonded to the heat sink at a surface, which is located far from the active layer, of the semiconductor laser device. Therefore, it becomes possible to reduce an influence, on the active layer, of the strain generated at the bonded surfaces due to the difference in thermal expansion coefficients between the semiconductor laser device and the heat sink. Thus, noise can be reduced.

DESCRIPTION OF PREFERRED EMBODIMENTS

Embodiments of the present invention are explained in detail below with reference to the drawings.

First Embodiment

Figure 1:
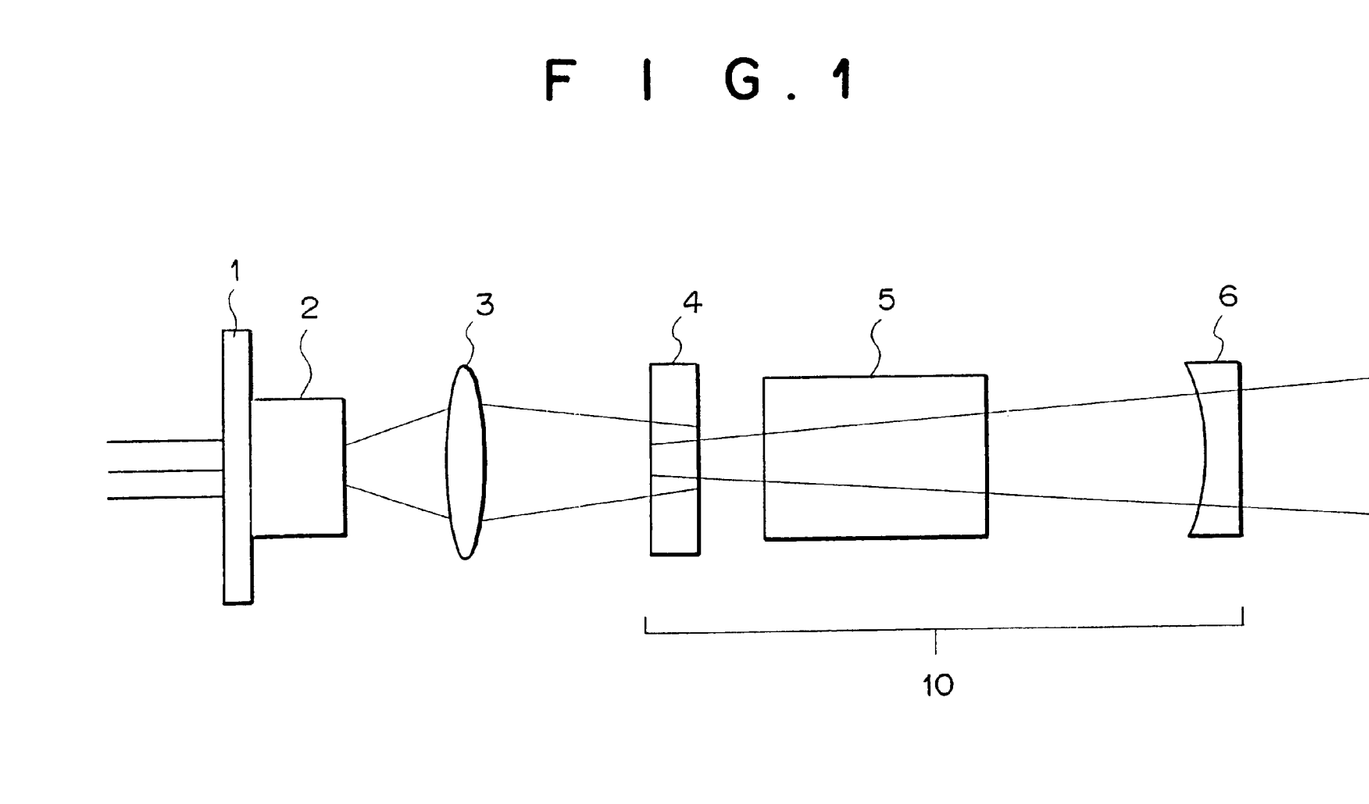
FIG. 1 is a diagram illustrating a construction of a solid-state laser light emitting apparatus as the first embodiment of the present invention.
Figure 2:
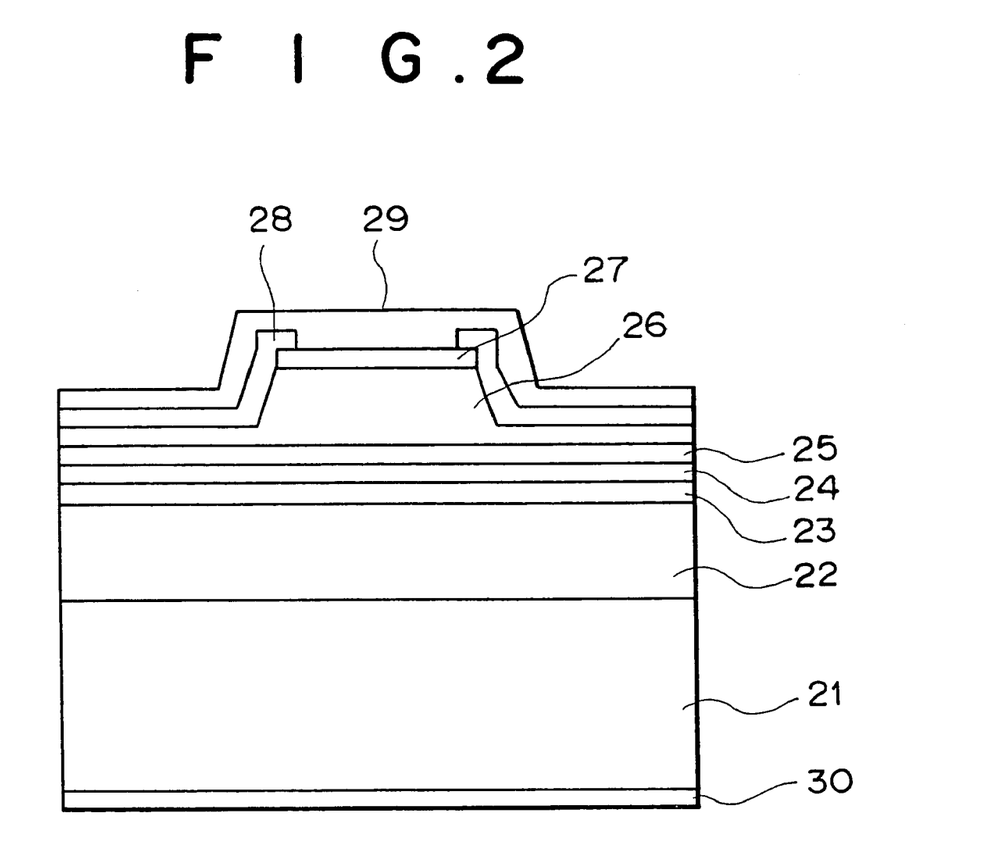
FIG. 2 is a cross-sectional view of a semiconductor laser device used in the first embodiment of the present invention.

FIG. 1 shows a construction of a solid-state laser light emitting apparatus as the first embodiment of the present invention, and FIG. 2 shows a cross-section of a high-power semiconductor laser device used as an excitation light source in the solid-state laser light emitting apparatus of FIG. 1.

First, explanations are provided on the solid-state laser light emitting apparatus. As illustrated in FIG. 1, the semiconductor laser device 2 is soldered onto the heat sink 1 by using AuSn as a solder in accordance with the junction-up configuration. The excitation optical output from the high-power semiconductor laser device 2 is condensed by a lens 3. When the condensed excitation light is incident on the Nd:YAG solid-state laser crystal 4, laser light having an oscillation wavelength of 946 nm is generated by the Nd:YAG solid-state laser crystal 4. The wavelength of the light generated by the Nd:YAG solid-state laser crystal 4 is then converted into a half of the wavelength by the $KNbO_3$ nonlinear crystal 5 to generate a second harmonic wave having a wavelength of 473 nm. The second harmonic light wave is resonated in the resonator 10, and is then output through the concave mirror 6, where the resonator 10 is constituted by the light-entrance surface of the Nd:YAG solid-state laser crystal 4 (the left surface of the Nd:YAG solid-state laser crystal 4 indicated in FIG. 1), and the $KNbO_3$ nonlinear crystal 5.

Nd:$YVO_4$, instead of Nd:YAG, or the like may be used as the above solid-state laser crystal 4, and KTP, instead of $KNbO_3$, may be used as the above $KNbO_3$ nonlinear crystal 5.

Next, explanations are provided on the semiconductor laser device 2, which is used as the excitation source of the above solid-state laser light emitting apparatus. As illustrated in FIG. 2, an n-type AlGaAs cladding layer 22, an undoped AlGaAs optical guide layer 23, an undoped active layer 24, an undoped AlGaAs optical guide layer 25, a p-type AlGaAs cladding layer 26, and a p-type GaAs cap layer 27 are stacked on an n-type GaAs substrate 21 in this order. In the stacked structure, a portion of the p-type AlGaAs cladding layer 26 is etched to form a mesa portion having a width of 50 micrometers. The etching is controlled so that remaining thickness of the p-type AlGaAs cladding layer 26 in portions other than the mesa portion is 0.2 micrometers. Thus, an index-guided waveguide is formed since the refractive index is equivalently deemed to be increased under the mesa portion.

Figure 9:
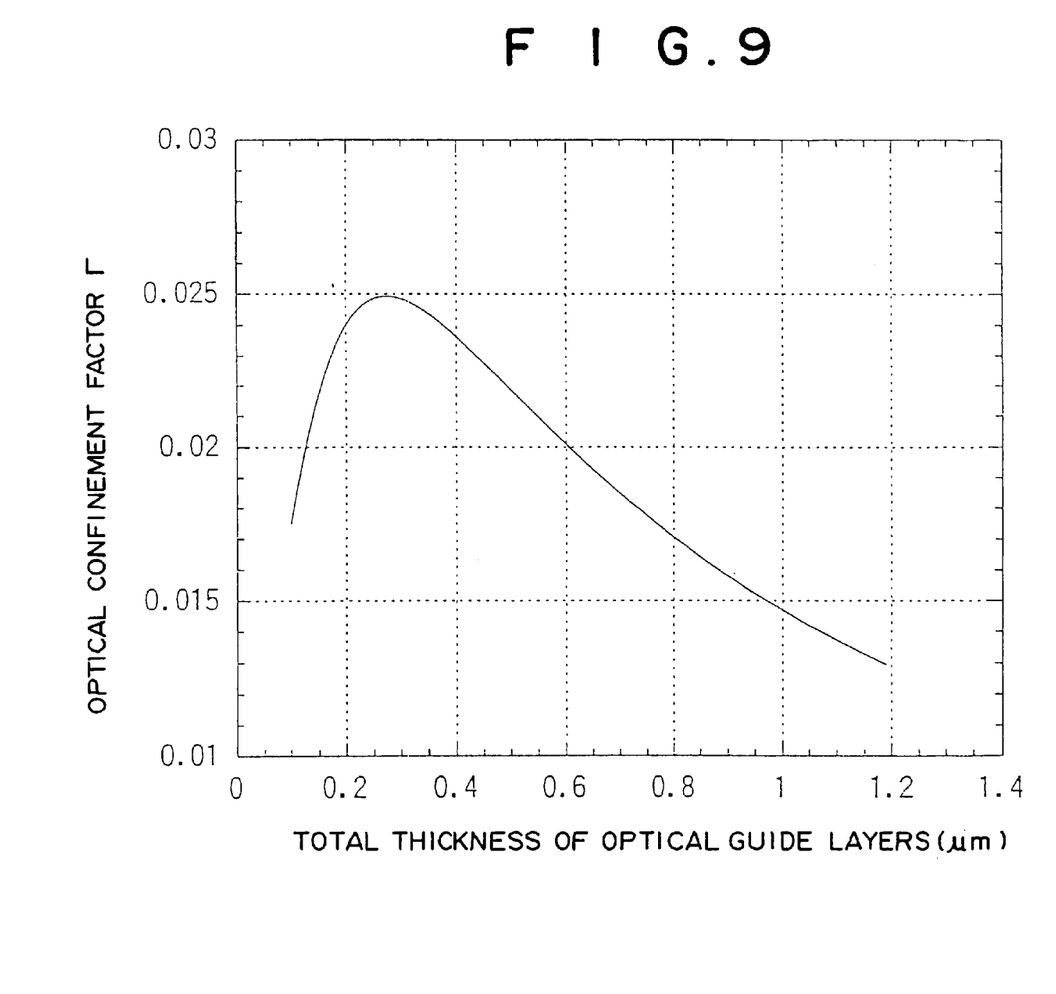
FIG. 9 is a graph indicating a relationship between the total thickness of the optical guide layers and an optical confinement factor $\Sigma$.

A relationship between a total thickness of the optical guide layers and an optical confinement factor $\Sigma$ is indicated in FIG. 9. Conventionally, the total thickness of the optical guide layers is about 0.3 micrometers, and the total thickness at which the optical confinement factor is locally maximum is used. On the other hand, according to the present invention, the optical guide layers are formed to have a total thickness of 0.7 micrometers, which makes the optical confinement factor $\Sigma$ smaller than the conventional value, to decrease the photon density in the active layer and obtain a stable optical output.

After the above etching of the p-type AlGaAs cladding layer 26, an insulation layer 28 is formed, and a portion of the insulation layer 28 is removed by lithography to produce an opening for disposing electrode material. Next, a p electrode 29 is formed on the portion from which the insulation layer 28 is removed, and an n electrode 30 is formed on the opposite side of the n-type GaAs substrate 21. Then, the layered structure formed as above is cleaved to form a resonant cavity of a predetermined length, and reflection films having reflectances of 10% and 90% are formed on the front and rear end faces resonant cavity, respectively. Thus, the formation of the semiconductor laser device 2 is completed.

Figure 3:
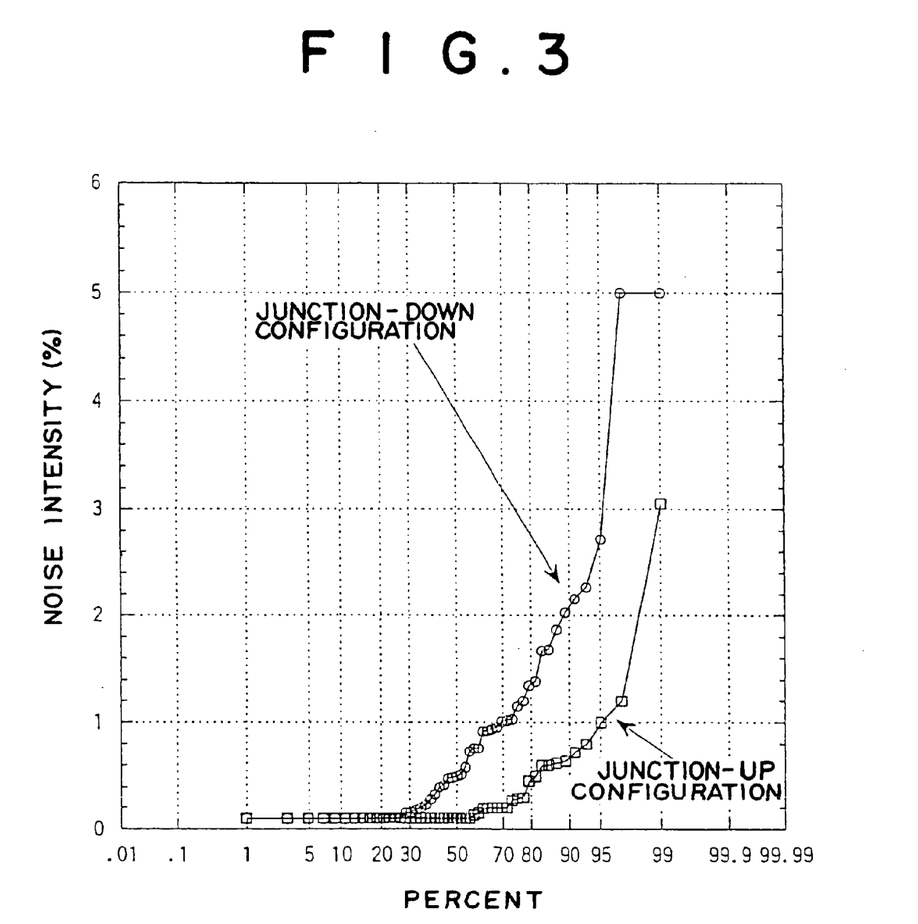
FIG. 3 is a diagram illustrating noise characteristics in junction-up and junction-down configurations.

FIG. 3 shows probability distributions of noise intensities in junction-up and junction-down configurations. The conventional semiconductor laser unit is fabricated in accordance with the junction-down configuration. On the other hand, according to the present invention, the semiconductor laser unit is fabricated in accordance with the junction-up configuration, and the noise intensity can be reduced to a level not greater than 3%.

Figure 6:
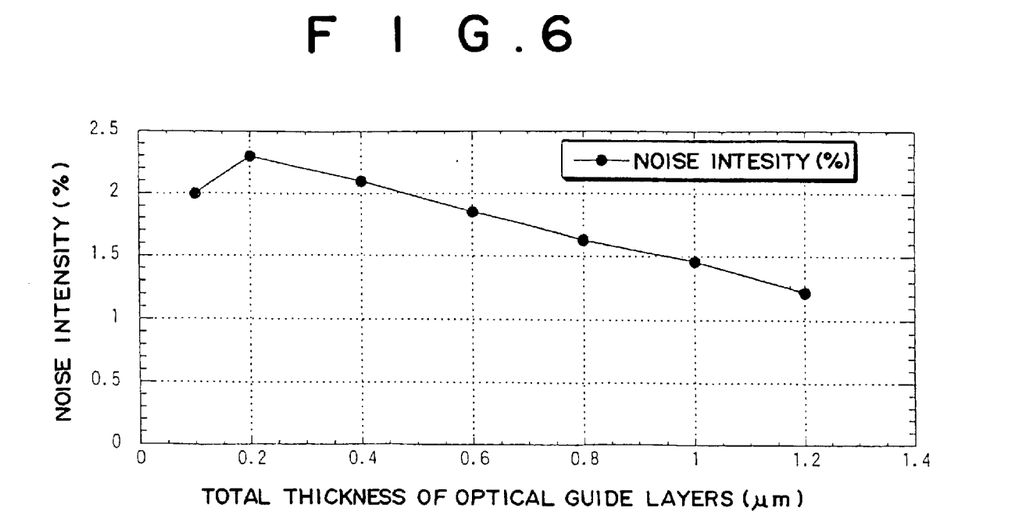
FIG. 6 is a graph indicating a relationship between a total thickness of optical guide layers and noise intensity.

FIG. 6 shows a relationship between the total thickness of the optical guide layers and the noise intensity. As illustrated in FIG. 6, the noise intensity can be reduced to a level not greater than 2% by increasing the total thickness of the optical guide layers and decreasing the optical confinement factor.

Figure 7:
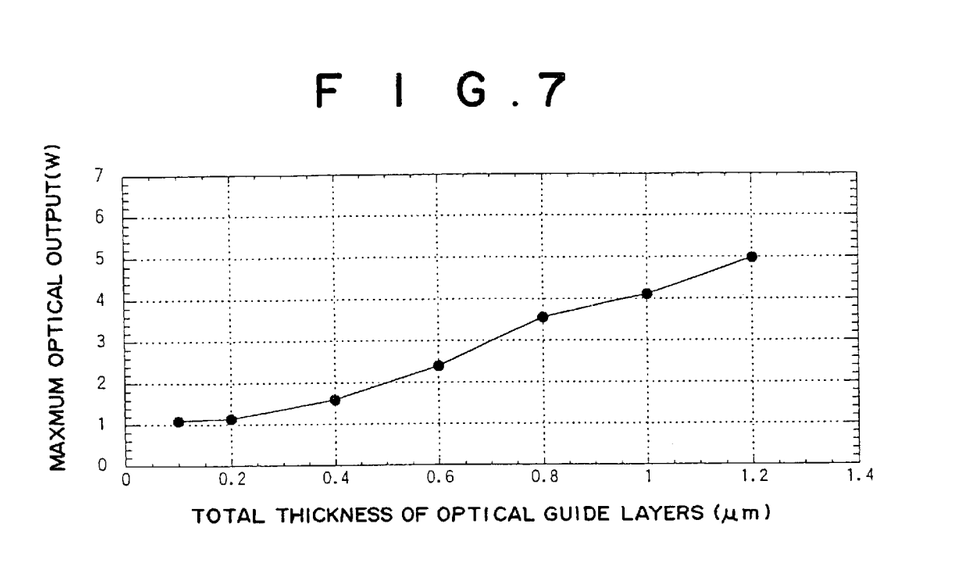
FIG. 7 is a graph indicating a relationship between the total thickness of the optical guide layers and a maximum optical output power.

FIG. 7 shows a relationship between the total thickness of the optical guide layers and the maximum optical output power. When the total thickness of the optical guide layers is increased, the photon density in the active layer decreases. Therefore, the optical output becomes stable, and finally the maximum optical output can be increased.

Figure 8:
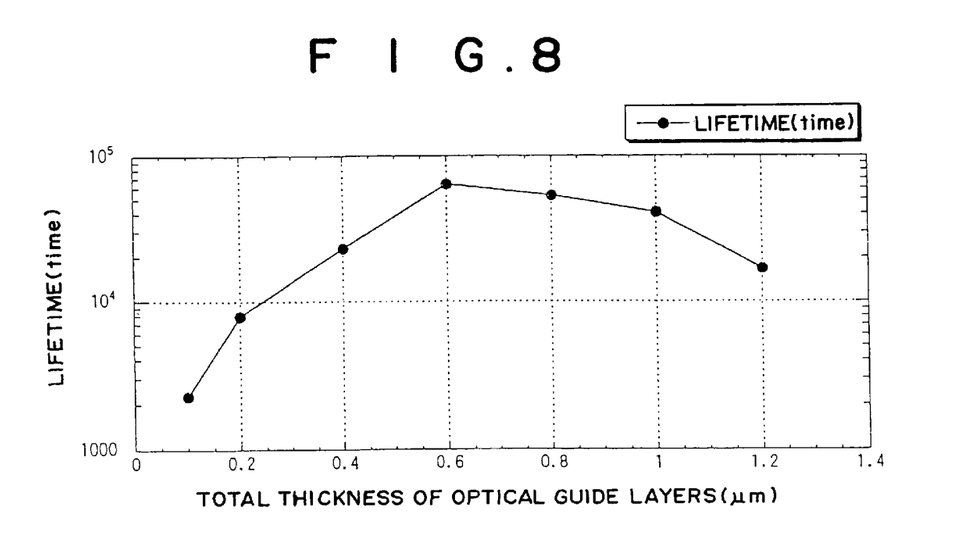
FIG. 8 is a graph indicating a relationship between the total thickness of the optical guide layers and a lifetime.

In addition, FIG. 8 shows a relationship between the total thickness of the optical guide layers and the lifetime. When the total thickness of the optical guide layers is not less than 0.5 micrometers, the photon density is small, and the COD level is high. Therefore, the lifetime is long. However, when the total thickness of the optical guide layers exceeds 1.0 micrometers, the lifetime decreases. This is because the internal loss of the waveguide increases corresponding to the increase in the total thickness of the optical guide layers, and therefore an operation current increases. Thus, in the semiconductor laser device used in the present invention, it is preferable to form the optical guide layers with the total thickness of 0.5 to 1.0 micrometers.

Based on the above considerations, it is possible to realize a semiconductor laser unit having a stable optical output and a long lifetime and producing low noise, by forming the optical guide layers with the total thickness not less than 0.5 to reduce the photon density, and mounting a semiconductor laser device on a heat sink to form the junction-up configuration which reduces the noise due to strain.

Second Embodiment

Next, the second embodiment is explained below.

Figure 4:
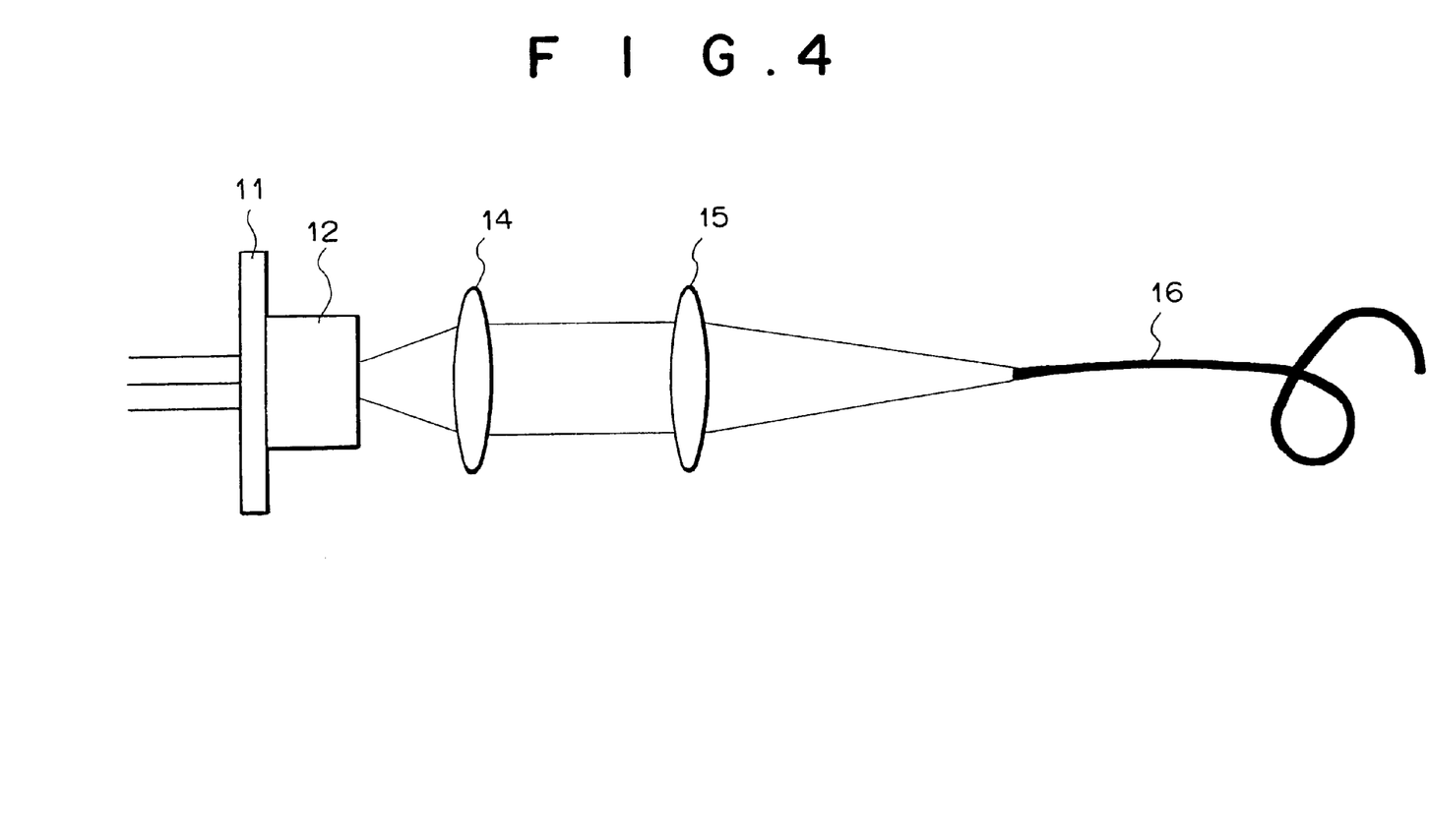
FIG. 4 is a diagram illustrating a construction of a portion of an optical fiber light emitting apparatus as the second embodiment of the present invention.
Figure 5:
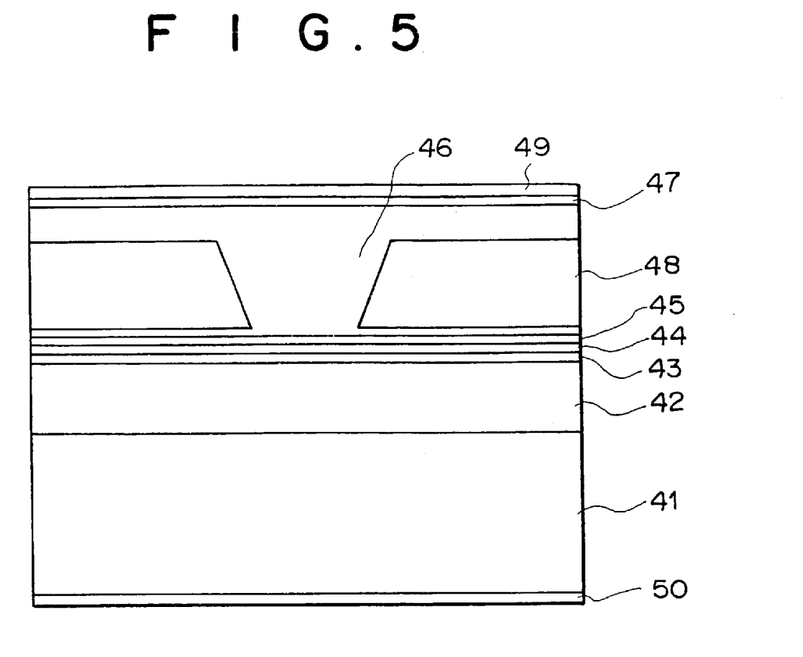
FIG. 5 is a cross-sectional view of a semiconductor laser device used in the second embodiment of the present invention.

FIG. 4 shows a construction of a portion of an optical fiber light emitting apparatus as the second embodiment of the present invention, and FIG. 5 shows a cross-section of a semiconductor laser device used in the second embodiment of the present invention.

First, the overall construction of the optical fiber light emitting apparatus is explained. As illustrated in FIG. 4, a semiconductor laser device 12 is bonded to a heat sink 11 by using AuSn as a solder to form the junction-up configuration. A portion of light output from the semiconductor laser device 12 is transformed by a collimator lens 14 to parallel rays, and the collimated light is coupled to an end of an optical fiber 16 by using the condenser lens 15.

Next, explanations are provided on the semiconductor laser device 12 used in the optical fiber light emitting apparatus of FIG. 4. An n-type AlGaAs cladding layer 42, an undoped AlGaAs optical guide layer 43, an undoped active layer 44, an undoped AlGaAs optical guide layer 45, a p-type AlGaAs cladding layer 46, and a p-type GaAs cap layer 47 are stacked on an n-type GaAs substrate 41 in this order. In this construction, the optical guide layers are formed to have a total thickness of 0.7 micrometers, which makes the optical confinement factor small. Although the semiconductor laser device 2 used in the first embodiment has a so-called ridge structure in which a portion of the cladding layer is removed by etching, the semiconductor laser device 12 used in the second embodiment has a so-called buried structure to realize an index-guided waveguide so that light waves are effectively confined in the active layer 44. The buried structure is realized in the semiconductor laser device 12 by replacing a portion of the p-type AlGaAs cladding layer 46 with an AlGaInP current-blocking layer 48, where the refractive index of the AlGaInP current-blocking layer 48 is smaller than that of the p-type AlGaAs cladding layer 46. After the formation of the AlGaInP current-blocking layer 48 and the p-type AlGaAs cladding layer 46, a p electrode 49 is formed, and an n electrode 50 is formed on the opposite side of the n-type GaAs substrate 41. Then, the layered structure formed as above is cleaved to form a resonant cavity having a predetermined length, and reflection films having reflectances of 10% and 90% are formed on the front and rear end faces of the resonant cavity, respectively. Thus, the formation of the semiconductor laser device 12 is completed.

Also in the second embodiment, the semiconductor laser device 12 having a long lifetime and a stable optical output with low noise is realized by the thick optical guide layers and the use of the junction-up configuration.

OTHER APPLICATION

In addition, the semiconductor laser unit according to the present invention may be used with an optical modulation device, instead of the solid-state laser apparatus or the optical fiber light emitting apparatus. When used with the optical modulation device, the advantages described above are also obtained.

In addition, all of the contents of the Japanese patent application, No.11(1999)-50356 are incorporated into this specification by reference.

What is claimed is:

1. A semiconductor laser unit comprising:

a semiconductor laser device including a stripe structure, a first optical guide layer of a first conductivity type, an active layer, a second optical guide layer of a second conductivity type, wherein each layer of the semiconductor laser device has a surface; and a heat sink;

wherein a total thickness of said first and second optical guide layers is equal to or more than 0.5 micrometers, and said semiconductor laser device is soldered onto said heat sink at a surface of the semiconductor laser device, where said surface to be soldered is the surface farthest away from said active layer of all of said surfaces of the semiconductor laser device, wherein the total thickness of said first and second optical guide layers is greater than or equal to 0.5 micrometers and less than or equal to 1.2 micrometers.

2. A semiconductor laser unit comprising:

a semiconductor laser device including a stripe structure having a width equal to or greater than 10 micrometers, and including a first optical guide layer of a first conductivity type, an active layer, a second optical guide layer of a second conductivity type, wherein each layer of the semiconductor laser device has a surface; and a heat sink;

wherein a total thickness of said first and second optical guide layers is equal to or more than 0.5 micrometers, and said semiconductor laser device is soldered onto said heat sink at a surface of the semiconductor laser device, where said surface to be soldered is the surface farthest away from said active layer of all of said surfaces of the semiconductor laser device, wherein the total thickness of said first and second optical guide layers is greater than or equal to 0.5 micrometers and less than or equal to 1.2 micrometers.

3. The semiconductor laser unit as claimed in claim 1 wherein the total thickness of said first and second optical guide layers is equal to 0.7 micrometers.

4. The semiconductor laser unit as claimed in claim 1 wherein said surface to be soldered is an exterior surface of the semiconductor laser device.

5. The semiconductor laser unit as claimed in claim 3 wherein said surface to be soldered is an exterior surface of the semiconductor laser device farthest from the active layer.

6. The semiconductor laser unit as claimed in claim 1 wherein said heat sink is soldered to said semiconductor laser device to form a junction-up configuration.

7. The semiconductor laser unit as claimed in claim 3 wherein said heat sink is soldered to said semiconductor laser device to form a junction-up configuration.

* * * * *